(12) United States Patent
Leobandung

(10) Patent No.: US 11,211,390 B2
(45) Date of Patent: Dec. 28, 2021

(54) STAIRCASE PATTERNING FOR 3D NAND DEVICES

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,756

(22) Filed: Oct. 11, 2018

(65) Prior Publication Data

US 2020/0119029 A1 Apr. 16, 2020

(51) Int. Cl.
| | |
|---|---|
| *H01L 27/11556* | (2017.01) |
| *H01L 27/11524* | (2017.01) |
| *H01L 29/423* | (2006.01) |
| *H01L 21/308* | (2006.01) |
| *H01L 27/11582* | (2017.01) |
| *H01L 27/1157* | (2017.01) |
| *H01L 29/51* | (2006.01) |

(52) U.S. Cl.
CPC .... *H01L 27/11556* (2013.01); *H01L 21/3086* (2013.01); *H01L 27/1157* (2013.01); *H01L 27/11524* (2013.01); *H01L 27/11582* (2013.01); *H01L 29/4234* (2013.01); *H01L 29/42324* (2013.01); *H01L 29/517* (2013.01)

(58) Field of Classification Search
CPC ......... H01L 27/11556; H01L 27/11524; H01L 27/1157; H01L 27/11582; H01L 27/11551; H01L 21/3086; H01L 29/42324; H01L 29/4234; H01L 27/11573
See application file for complete search history.

(56) References Cited

U.S. PATENT DOCUMENTS

| | | | | |
|---|---|---|---|---|
| 8,445,347 | * | 5/2013 | Alsmeier | H01L 27/11556 438/264 |
| 8,736,069 | * | 5/2014 | Chiu | H01L 23/522 257/774 |
| 9,478,495 | * | 10/2016 | Pachamuthu | H01L 27/11519 |
| 9,589,979 | | 3/2017 | Hong | |
| 9,711,529 | | 7/2017 | Hu et al. | |
| 2011/0169067 | * | 7/2011 | Ernst | H01L 27/0688 257/316 |
| 2012/0068259 | * | 3/2012 | Park | H01L 27/11565 257/329 |
| 2012/0282779 | | 11/2012 | Arnold et al. | |
| 2015/0085579 | * | 3/2015 | Chen | H01L 27/11582 365/185.17 |
| 2016/0043093 | * | 2/2016 | Lee | H01L 29/40114 257/314 |

(Continued)

*Primary Examiner* — Tuan A Hoang

(74) *Attorney, Agent, or Firm* — Tutunjian & Bitetto, P.C.; Robert Sullivan

(57) ABSTRACT

Semiconductor devices and methods of forming the same include forming an etch mask on a stack of alternating dielectric layers and conductor layers. An exposed portion of a dielectric layer and a conductor layer is etched away to form a wordline. The forming and etching steps are repeated, adding additional etch mask material at each iteration, to form respective wordlines at each iteration.

5 Claims, 3 Drawing Sheets

(56) References Cited

U.S. PATENT DOCUMENTS

| | | | | |
|---|---|---|---|---|
| 2016/0133630 | * | 5/2016 | Kim | H01L 27/1052 438/631 |
| 2016/0233232 | * | 8/2016 | Im | H01L 27/1157 |
| 2016/0307632 | * | 10/2016 | Lee | H01L 23/5286 |
| 2017/0179028 | | 6/2017 | Lee et al. | |
| 2018/0144997 | | 5/2018 | Yu et al. | |
| 2019/0096810 | * | 3/2019 | Zhu | H01L 21/76832 |
| 2020/0075623 | * | 3/2020 | Ito | H01L 27/1157 |

* cited by examiner

STAIRCASE PATTERNING FOR 3D NAND DEVICES

BACKGROUND

Technical Field

The present invention generally relates to semiconductor device fabrication and, more particularly, to the fabrication of three-dimensional NAND floating gate memory devices.

Description of the Related Art

NAND floating gate memory devices use a number of input lines on a floating gate structure. The input lines store charges on the floating gate structure, thereby changing the electrical properties of the device in a nonvolatile manner. The electrical properties can then be read back to retrieve information from the device.

SUMMARY

A method of forming a semiconductor device includes forming an etch mask on a stack of alternating dielectric layers and conductor layers. An exposed portion of a dielectric layer and a conductor layer is etched away to form a wordline. The forming and etching steps are repeated, adding additional etch mask material at each iteration, to form a respective wordline for each iteration.

A logic device includes a set of wordlines. Each wordline has a conductor layer and a dielectric layer. Each wordline has a width that is smaller than any underlying wordlines from the set of wordlines. The dielectric layer of each of the set of wordlines has a same thickness. A channel structure runs through each of the plurality of wordlines and conducts electricity unless a threshold voltage is applied to each of the plurality of wordlines.

A memory device includes a set of wordlines. Each wordline has a conductor layer and a dielectric layer. Each wordline has a width that is smaller than any underlying wordlines from the set of wordlines. The dielectric layer of each of the set of wordlines has a same thickness. A channel structure runs through each of the wordlines and conducts electricity unless a threshold voltage is applied to each of the set of wordlines. There is a floating gate structure between the wordlines and the channel structure. Charges stored in regions of the floating gate structure alter the threshold voltage for respective wordlines.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide staircase NAND devices that can be used, for example, in memory devices. Whereas staircase structures can be formed in some cases by successively patterning a stack of layers to form the staircase upward from the bottom of the stack, such a process necessitates the use of differing thicknesses in the layers, as the bottom layers will be exposed to many etches before the top layer is formed. Bottom-up fabrication also necessitates the use of a thick etch mask, with material being etched away at each step. The removal of material is difficult to accomplish with precision.

The present embodiments therefore fabricate the staircase structure from the top down. After each layer from the stack is etched, additional masking material is deposited. Each layer of the stack is thereby exposed to only one etching step, making it possible for all of the layers to have a uniform thickness. Additionally, the etch mask itself can be made much thinner, as it is not etched at all until after all the steps in the staircase structure have been formed. The present embodiments can thus be used to form NAND logic gates, but can also be combined with a floating gate structure to store information.

Figure 1:
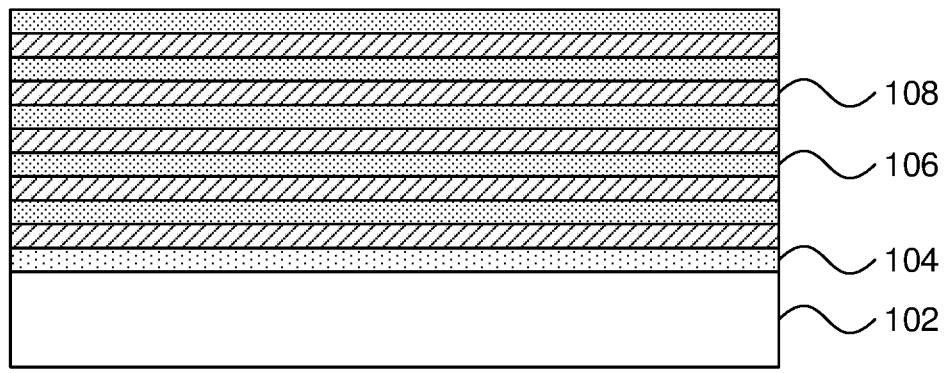
FIG. 1 is a cross-sectional diagram of a step in the formation of a NAND memory device that shows a stack of alternating dielectric layers and conductor layers in accordance with an embodiment of the present invention.

Referring now to the drawings in which like numerals represent the same or similar elements and initially to FIG. 1, a cross-sectional view of a step in the formation of a NAND memory device is shown. A stack of alternating conductor layers 108 and dielectric layers 106 is formed over a semiconductor substrate 102, with a dielectric cap 104 between the substrate 102 and the stack. The stack can be formed by successive deposition steps using any appropriate deposition process including, for example, chemical vapor deposition (CVD), atomic layer deposition (ALD), physical vapor deposition (PVD), and gas cluster ion beam (GCIB) deposition. It is specifically contemplated that each of the dielectric layers 106 may have a same thickness. Although five layers are shown in the present figures, each representing a distinct wordline in the final device, it should be understood that any number of such layers can be formed. In one exemplary embodiment, the conductor layers 108 can be between about 50 nm and about 100 nm thick, while the dielectric layers 106 can be between about 10 nm and about 100 nm thick.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate. In other embodiments, the semiconductor substrate may include one or more embedded devices such as, e.g., transistors, and may therefore have a passivating dielectric top layer on which the dielectric cap 104 rests. The semiconductor substrate 104 may furthermore include a bottom bitline conductor that provides electrical connectivity to the device.

The conductor layers 108 may be formed from any appropriate conductive metal such as, e.g., tungsten, nickel, titanium, molybdenum, tantalum, copper, platinum, silver, gold, ruthenium, iridium, rhenium, rhodium, and alloys thereof. The conductor layers 108 may alternatively be formed from a doped semiconductor material such as, e.g., doped polysilicon, or from a conductive nitride such as titanium nitride. The dielectric layers 106 can be formed from any appropriate dielectric material such as, e.g., silicon nitride, that has etch selectivity with the dielectric cap 104. As used herein, the term "selective" in reference to a material removal process denotes that the rate of material removal for a first material is greater than the rate of removal for at least another material of the structure to which the material removal process is being applied. In alternative embodiments, the conductor layers 108 can be replaced by a sacrificial material that is replaced with a conductor in a gate-last process flow.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
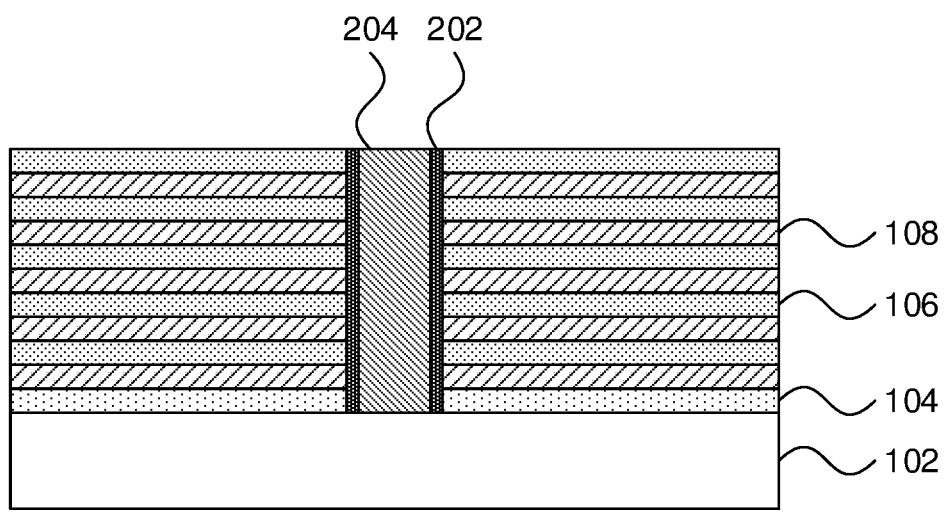
FIG. 2 is a cross-sectional diagram of a step in the formation of a NAND memory device that shows a floating gate structure and a channel structure in accordance with an embodiment of the present invention.

Referring now to FIG. 2, a cross-sectional view of a step in the formation of a NAND memory device is shown. A via is formed in the stack of alternating layers 106 and 108 and dielectric cap 104. Floating gate structure 202 and channel structure 204 are then formed in the via. It is specifically contemplated that the floating gate structure 202 can be formed as a multi-layer structure that includes a first insulating layer, a trap layer, and a second insulating layer. In one specific embodiment, the floating gate structure 202 can be formed using silicon dioxide as the insulating layers and silicon nitride as the trap layer, but it should be understood that any appropriate materials may be used instead. The insulator layers in the floating gate structure are formed at such a thickness that tunneling of electrons from a nearby conductor layer 108 is possible at operational voltages, while inhibiting further passage of those electrons into the channel structure 204, such that the electrons remain trapped within the trap layer.

The channel structure 204 is shown as penetrating the dielectric cap 104 to contact the substrate 102. It should be understood that the bottom portion of the channel structure 204 can form an electrical connection with a device or conductive contact that is embedded in the substrate 102. The channel structure 204 can be formed from any appropriate semiconductor material such as, e.g., polysilicon. During operation, the surface of the channel structure 204 that is in the vicinity of the conductor layer 108 of a wordline becomes the channel of a local transistor, with the conductor 108 acting as a gate and with the regions of the channel structure 204 just above and below the conductor 108 effectively acting as source and drain regions. It should be noted that these source and drain regions do not need to be doped, as they can be inverted by the field exerted by conductor layer 108.

It should be noted that, although a floating gate structure 202 is shown as being a part of the present embodiments, this structure is used for storing information in a memory device. A simple NAND logic gate does not need such a structure and can, instead, replace the floating gate structure 202 with a gate dielectric layer.

The via can be formed by forming a mask that leaves a portion of the topmost dielectric layer 106 exposed. The stack of layers can then be etched using one or more anisotropic etches, such as a reactive ion etch (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. The via can be formed with any appropriate cross-sectional shape including, for example, rectangular and circular via cross-sections.

The floating gate structure 202 can then be formed in the via by successive conformal depositions of the first insulating layer, the trap layer, and the second insulating layer. The deposition of the floating gate structure 202. Material from the deposition of these layers can then be cleared from the bottom of the via using an appropriate anisotropic etch, removing the material from horizontal surfaces without substantially affecting the floating gate structure 202 on the sidewalls of the via.

Figure 3:
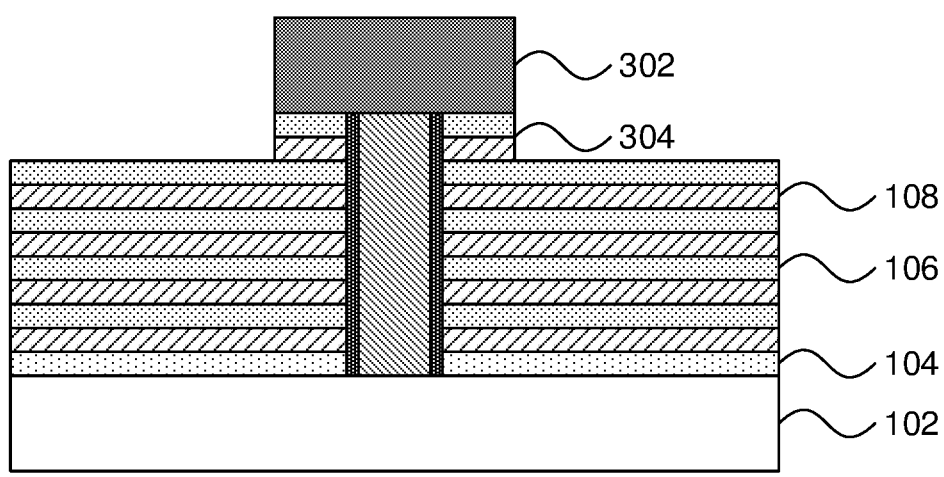
FIG. 3 is a cross-sectional diagram of a step in the formation of a NAND memory device that shows an etch mask being formed on the stack and the etch mask being used to etch a first wordline in accordance with an embodiment of the present invention.

Referring now to FIG. 3, a cross-sectional view of a step in the formation of a NAND memory device is shown. An etch mask 302 is formed over the channel 204 on the stack of layers. The etch mask 304 is used as a mask for two selective anisotropic etches, a first to remove the exposed portion of the top dielectric 106 and a second to remove the exposed portion of the top conductor layer 108. The result is first wordline 304. The second set of layers is then exposed.

The etch mask 302 can be formed by any appropriate process, including photolithography. A pattern is produced by applying a photoresist to the surface to be etched. The photoresist is exposed to a pattern of radiation and the pattern is developed into the photoresist utilizing a resist developer. Once the patterning of the photoresist is completed, the sections covered by the photoresist are protected while the exposed regions are removed using a selective etching process that removes the unprotected regions. In alternative embodiments, the exposed portions can be removed, leaving the unexposed portions in place.

Figure 4:
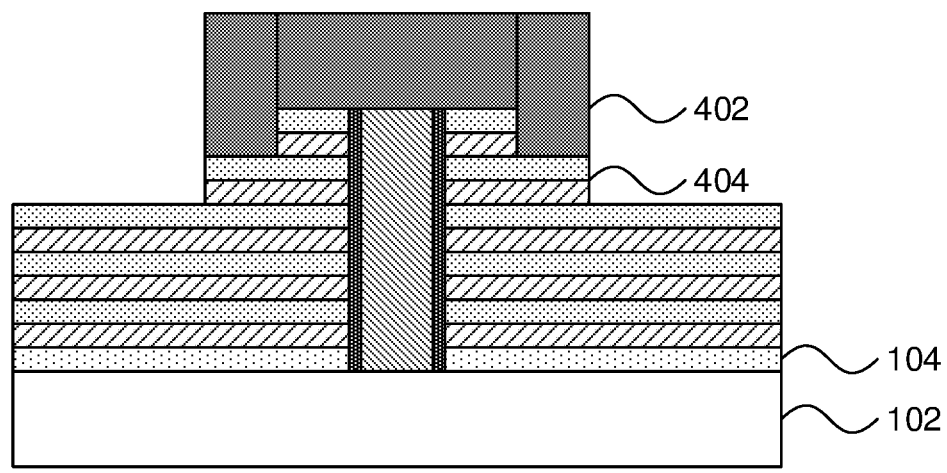
FIG. 4 is a cross-sectional diagram of a step in the formation of a NAND memory device that shows additional etch mask material being deposited and being used to etch a second wordline in accordance with an embodiment of the present invention.

Referring now to FIG. 4, a cross-sectional view of a step in the formation of a NAND memory device is shown. Additional mask material 402 is deposited around the etch mask 302. It is specifically contemplated that the additional mask material 402 can be formed by conformally depositing a layer of mask material, such as silicon nitride, and etching it to form sidewall spacer on the existing etch mask 302. The new, larger etch mask is used to etch down into the next set of layers, creating the second wordline 404. This process is repeated, depositing additional mask material and etching the next set of layers, until every wordline is exposed.

Figure 5:
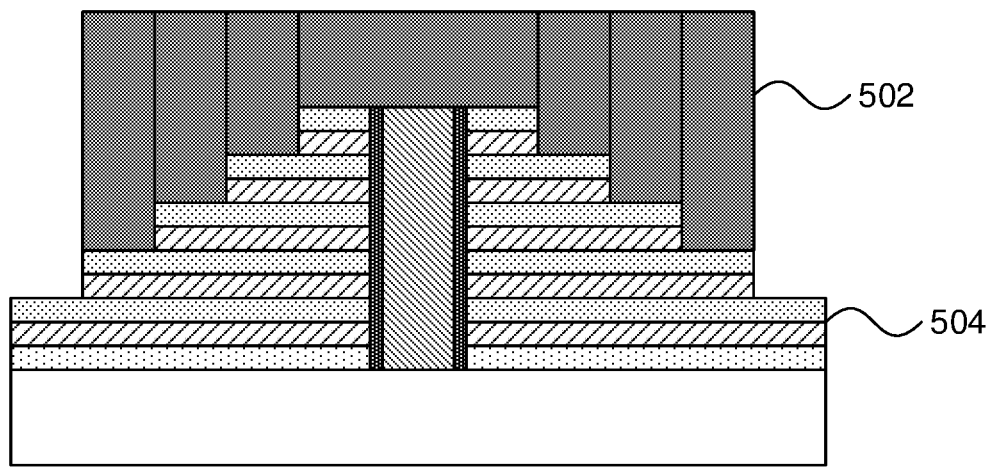
FIG. 5 is a cross-sectional diagram of a step in the formation of a NAND memory device that shows the formation of a full set of wordlines, with corresponding etch masks, in accordance with an embodiment of the present invention.

Referring now to FIG. 5, a cross-sectional view of a step in the formation of a NAND memory device is shown. The final mask 502 is shown, with successive additions of material being used to expose each wordline layer 504. The wordline layers 504 each extend a sufficient distance beyond the limits of the layer above to provide a contact pad for electrical access.

Figure 6:
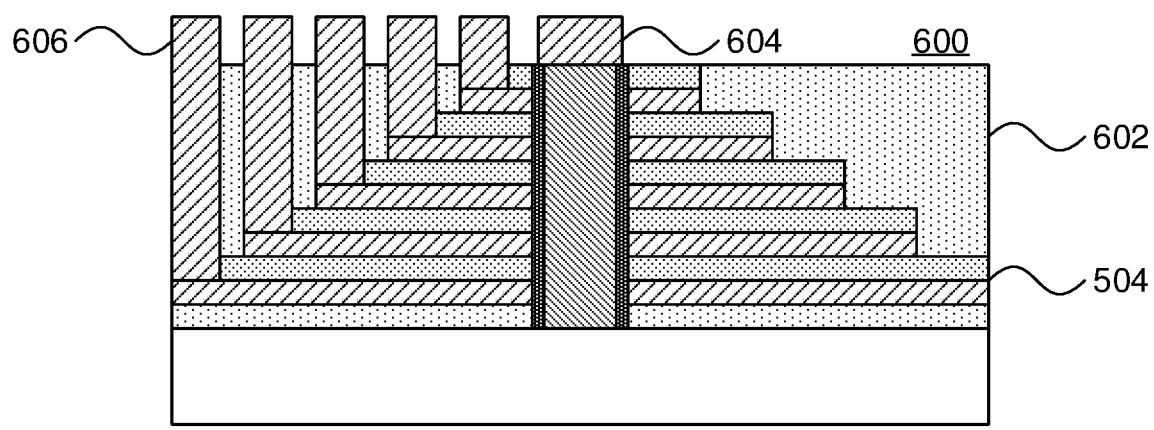
FIG. 6 is a cross-sectional diagram of a step in the formation of a NAND memory device that shows the formation of electrical contacts in accordance with an embodiment of the present invention.

Referring now to FIG. 6, a cross-sectional view of a step in the formation of a NAND memory device is shown. A passivating dielectric layer 602 is deposited over the wordline layers 504 and is polished down to the height of the topmost wordline layer 504 using, e.g., chemical mechanical planarization (CMP). A bitline contact 604 is formed on the channel 204 and respective wordline contacts 606 are formed to each of the wordline layers 504 by, e.g., forming vias through the passivating layer 602 and the dielectric layers 106 and depositing an appropriate conductor material. This completes the NAND memory device 600. A bottom bitline contact or ground contact (not shown) can be present in the substrate 102 or a separate bottom bitline contact can be formed, directly or through embedded transistors.

CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

During operation, the NAND memory device 600 can be used to store information on each wordline, to read a state of each wordline, and to erase a state of each wordline. The basic structure of the device uses NAND logic, where an output voltage on the bitline terminal 604 will be a logical "one" unless each and every wordline 504 has a logical "one" voltage as well.

The trap layer in the floating gate 202 is configured to hold electrons, the presence of which creates a local charge that alters the threshold voltage of the nearby channel 204. This charge lowers or raises the threshold voltage, such that a lower or higher voltage on the respective wordline 504 will have the effect of a logical "one" or "zero" at that wordline. Thus a low read voltage (e.g., between about $_1$V ant 2V) can be applied on a wordline to determine whether there is a stored charge.

Table 1 shows a voltage/logic diagram of an example of reading a voltage from a given wordline (WL2). The other wordlines all have a moderate voltage (e.g., about 3V) that turn on the local transistor in the channel structure 204 regardless of whether there is a charge present. A low voltage (e.g., between about 0V and about 1V) is applied to the bitline BL. A low voltage (e.g., between about 1V and about 2V) is applied to WL2. It should be understood that these values are supplied solely for the sake of illustration and that the magnitude of low- and medium-voltage values can be varied and adjusted according to the materials selected and the desired device properties.

TABLE 1

| Line | Applied voltage |
| --- | --- |
| WL1 | 3 V |
| WL2 | 1 V |
| WL3 | 3 V |
| WL4 | 3 V |
| WL5 | 3 V |
| BL | 0 V |

In the beginning of the read operation, the bit line is precharged high. The voltage that is read at the bitline BL will depend on the stored charge state of the floating gate 202 at WL2. If there are no charges stored in the trap layer of the floating gate 202, then the applied voltage will be insufficient to trigger the channel 204 at WL2, putting WL2 a logical "zero" state. The NAND operation of the device, with four wordlines at a logical "one" And one wordline at a logical "zero," will result in the output at the BL being a logical "one" or high. However, if there are stored charges in the trap layer, the threshold voltage of the nearby channel 204 will be lowered enough that the low voltage on WL2 is enough to represent a logical "one." In this case, all five wordlines will be at a logical "one" and the output at the bitline will be a logical "zero" or zero voltage.

Table 2 shows a voltage/logic diagram of an example of storing charge at the floating gate 202 at a wordline WL2. The other wordlines again all have moderate voltages that represent the logical "one" state, a low voltage is applied to the bitline BL, and a high voltage (e.g., between about 5V and about 8V) is applied to WL2.

TABLE 2

| Line | Applied voltage |
| --- | --- |
| WL1 | 3 V |
| WL2 | 8 V |
| WL3 | 3 V |
| WL4 | 3 V |
| WL5 | 3 V |
| BL | 0 V |

The high voltage on WL 2 causes the output at BL to be a logical "zero," as all of the wordlines are activated. In addition, the voltage causes electrons to tunnel through the first insulating layer of the floating gate 202. The electrons become trapped in the trap layer of the floating gate 202, unable to move back to the wordlines or onward to the channel 204. The charges therefore accumulate on the floating gate 202, with the electrical fields exerted by the accumulated charges affecting the threshold voltage of the nearby portion of the channel 204.

Table 3 shows a voltage/logic diagram of an example of removing charge from the floating gate 202 at a wordline WL2. The other wordlines again all have moderate voltages that represent the logical "one" state, a low voltage is applied to the bitline BL, and a high negative voltage (e.g., between about −5V and about −8V) is applied to WL2.

TABLE 3

| Line | Applied voltage |
| --- | --- |
| WL1 | 3 V |
| WL2 | −8 V |
| WL3 | 3 V |

TABLE 3-continued

| Line | Applied voltage |
|------|-----------------|
| WL4  | 3 V             |
| WL5  | 3 V             |
| BL   | 0 V             |

The large negative voltage causes electrons to tunnel back through the first insulator layer of the floating gate 202, back into the conductor layer of WL2. This returns the floating gate 202 to a neutral charge and returns the threshold voltage of the nearby region of channel 204 to its default state.

Figure 7:
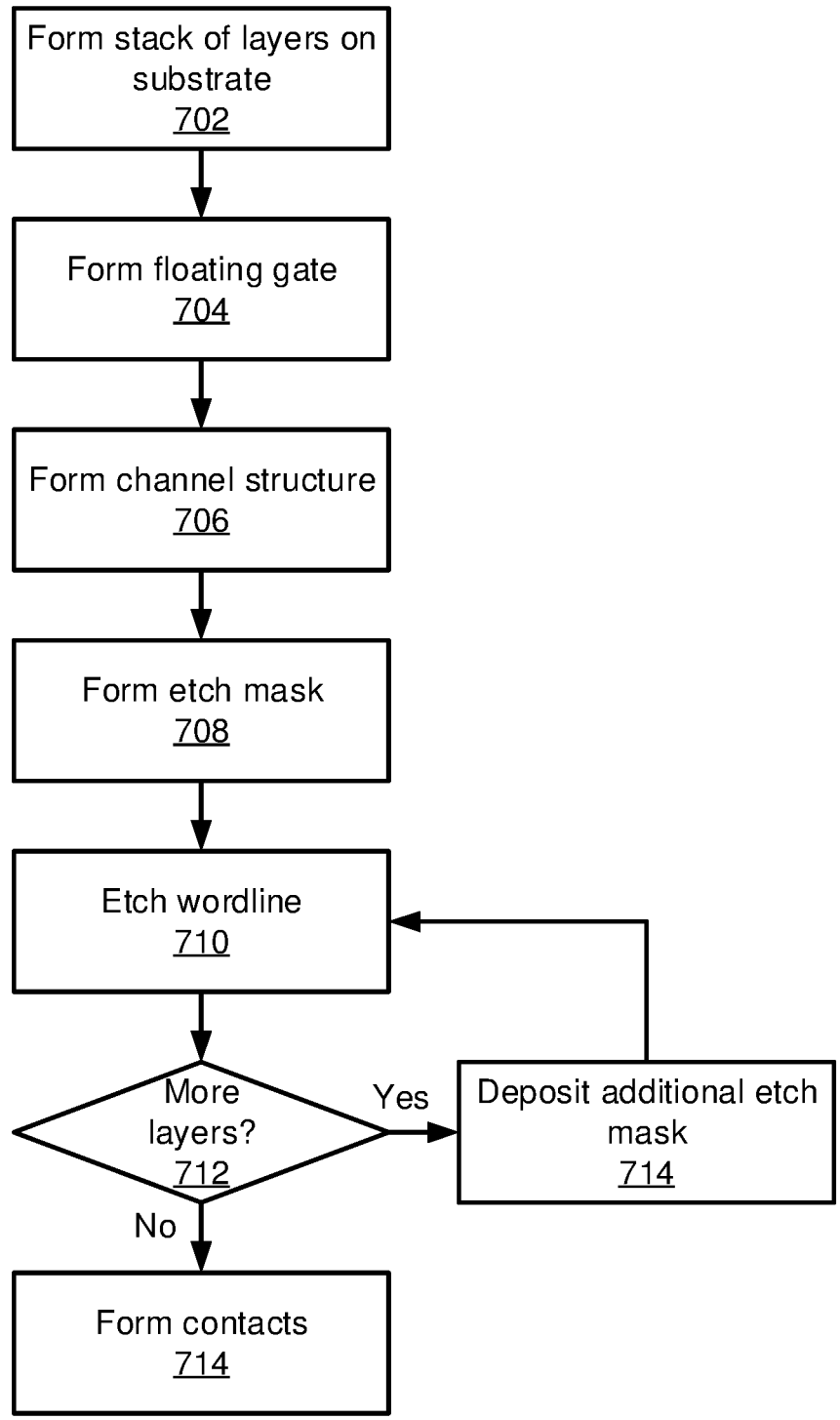
FIG. 7 is a block/flow diagram of a method of forming a NAND memory device in accordance with an embodiment of the present invention.

Referring now to FIG. 7, a method of forming a NAND memory device is shown. Block 702 forms the stack of alternating insulator layers 106 and conductor layers 108. It should be understood that, in some embodiments, the stack of layers may be purchased or acquired from a third-party supplier and need not be fabricated in-house. It is specifically contemplated that the insulator layers 106 can be formed from silicon nitride and that the conductor layers 108 can be formed from a metal, but it should be understood that any appropriate insulating and conductive materials can be selected for the respective structures.

Block 704 forms the floating gate 202. In particular, block 704 forms a via through the stack of layers and then conformally deposits a multi-layer of materials including a first insulator layer, a trap layer, and a second insulator layer that can be formed from, e.g., silicon dioxide, silicon nitride, and silicon dioxide, respectively. Block 704 etches away any material from the multi-layer that is on a horizontal surface using one or more anisotropic etches. Block 706 then forms the channel structure 204 by depositing material to fill the remainder of the via. Block 706 can, for example, deposit the material using any appropriate deposition process and then polish down to the height of the top surface of the top dielectric layer 106.

Block 708 forms an etch mask 302 over the floating gate 202 and the channel structure 204 as well as a portion of the top layer of the stack of alternating layers. Block 710 etches down into the top dielectric layer 106 and conductor layer 108 of the stack of layers using successive selective etches to form the first wordline 304. Block 712 determines whether there are more layers in the stack of alternating layers. If so, block 714 deposits additional etch mask and block 710 etches the next wordline. This continues until block 712 determines that there are no more wordlines to etch. At that point, block 714 forms electrical contacts to the wordlines 504 and to the channel structure 204 to finish the device. Block 714 first forms a passivating layer 602 over the wordlines 504 and then forms vias through the passivating layer down to each of the wordlines before depositing conductive material.

Having described preferred embodiments of staircase patterning for 3D NAND devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   etching a via having a rectangular cross-section through a stack of alternating silicon nitride layers and metal layers and through a dielectric layer underlying the stack to expose an underlying substrate;
   forming a gate structure and an undoped polysilicon channel core in the via in the stack of alternating silicon nitride layers and metal layers, the gate structure including a floating gate formed from a first silicon dioxide insulating layer, a silicon nitride trap layer, and a second silicon dioxide insulating layer, wherein the channel makes an electrical connection with a contact in the underlying substrate;
   photolithographically forming an initial etch mask, on the stack of alternating silicon nitride layers and metal layers, and over the gate structure embedded in the stack, leaving portions of the stack exposed on opposing sides of the etch mask;
   etching away the exposed portions of the silicon nitride layer and the metal layer to form a wordline, using separate respective anisotropic etches;
   repeating said forming and etching, adding additional silicon nitride at each iteration to sidewalls of the etch mask from the previous iteration, to form respective wordlines at each iteration, wherein adding additional etch mask material comprises:
      conformally depositing silicon nitride around the etch mask from the previous iteration to form a new etch mask; and
      anisotropically etching away deposited silicon nitride from horizontal surfaces around the new etch mask; and
   forming respective electrical contacts to a metal layer of each wordline and a bitline contact to the polysilicon channel core, wherein the electrical contact to the polysilicon channel core directly contacts an entire top surface of the polysilicon channel core.

2. The method of claim 1, wherein each silicon nitride layer in the stack of alternating silicon nitride layers and metal layers has a same thickness.

3. The method of claim 1, further comprising depositing a passivating dielectric over the wordlines.

4. The method of claim 1, further comprising forming the stack of alternating silicon nitride layers and metal layers on a substrate before forming the initial etch mask.

5. The method of claim 1, wherein adding additional silicon nitride at each iteration includes depositing silicon nitride to a same thickness at each iteration.

* * * * *